United States Patent [19]

Scannell et al.

[11] 4,206,406
[45] Jun. 3, 1980

[54] MEANS FOR ADJUSTING THE ZERO POINT SETTING OF A METER

[75] Inventors: Edward F. Scannell, Saugus; Donald E. Rogers, Lynn, both of Mass.

[73] Assignee: General Electric Company, New York, N.Y.

[21] Appl. No.: 948,171

[22] Filed: Oct. 2, 1978

[51] Int. Cl.² ............................................. G01R 1/00
[52] U.S. Cl. ............................. 324/154 R; 324/151 R
[58] Field of Search ............... 324/150, 151 R, 151 A, 324/154 R, 154 PB

[56] References Cited

U.S. PATENT DOCUMENTS

| | | | |
|---|---|---|---|
| 1,501,698 | 7/1924 | Beckert | 324/154 R |
| 1,661,214 | 3/1928 | Carpenter | 324/154 R |

Primary Examiner—Michael J. Tokar
Attorney, Agent, or Firm—Paul E. Rochford; Walter C. Bernkopf; Philip L. Schlamp

[57] ABSTRACT

Adjustment of the zero point of an instrument is achieved by rotation of a rotary element extending through the casing of the instrument. The rotary motion of the rotary element is translated into a lateral motion of an intermediate adjustment element. The lateral motion is a side to side motion within the instrument relative to the sides of the instrument casing. The lateral motion of the intermediate element is in turn translated into a pivot motion of a suspension element of the instrument. The pivoting of the suspension element causes deflection and adjustment of the indicating element of the instrument from which readings of the instrument mechanism are taken.

8 Claims, 8 Drawing Figures

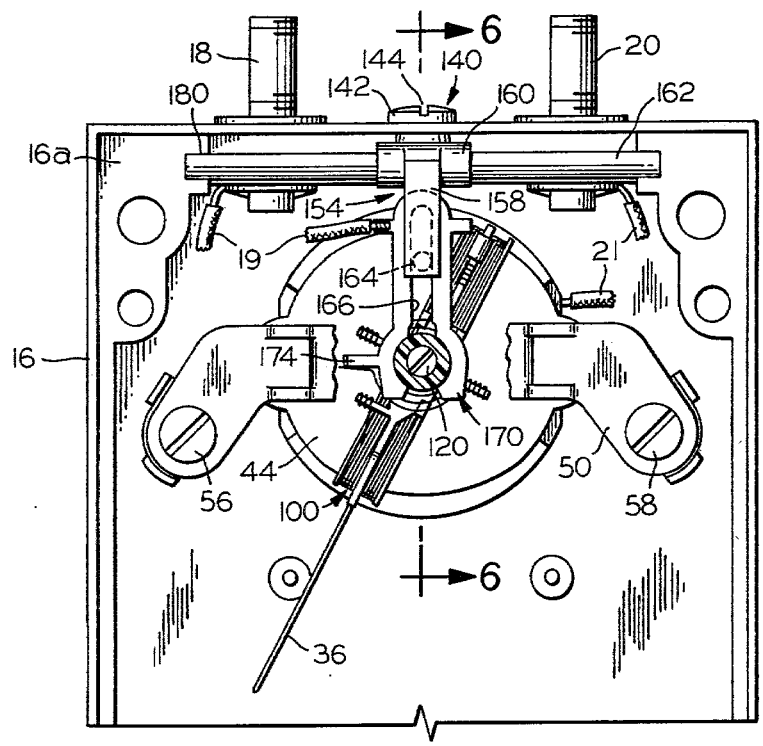
FIG. 5
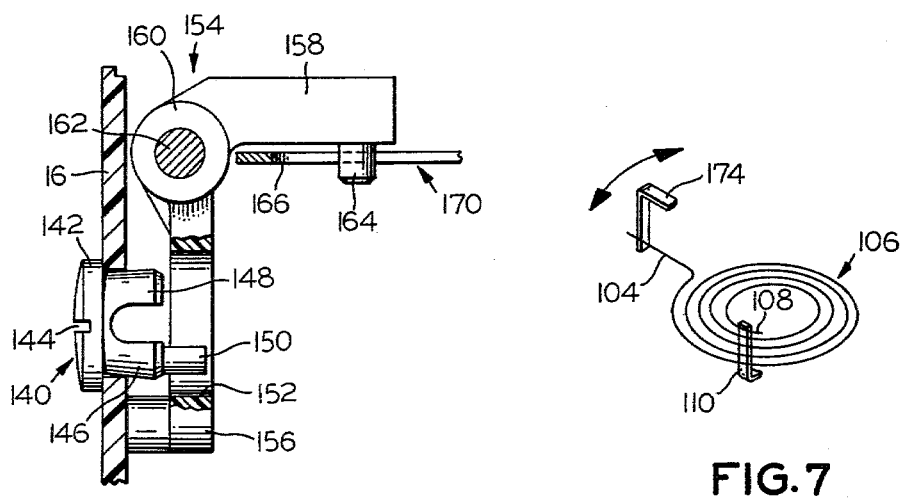
FIG. 6
FIG. 7

MEANS FOR ADJUSTING THE ZERO POINT SETTING OF A METER

CROSS-REFERENCE TO RELATED APPLICATIONS

This application relates to the application of Edward F. Scannell entitled Adjustable Spring Regulator For Setting Indicating Instrument Pointer, Ser. No. 948,174, filed Oct. 2, 1978 and assigned to the same assignee as this application.

This application also relates to the application of William J. Schultz and Carl Van Bennekom, entitled Pivot Insert Method and Article, Ser. No. 948,191, filed Oct. 2, 1978 and assigned to the same assignee as the subject application.

This application further relates to the application of Carl F. Van Bennekom, Donald E. Rogers and Edward F. Scannell, entitled Electrical Current Indicating Meter, Ser. No. 948,173 filed Oct. 2, 1978 and assigned to the same assignee as this application.

Further this application relates to the application of William J. Schultz and Carl F. Van Bennekom, entitled Magnetic System for Electrical Current Indicating Meter, Ser. No. 948,172 filed Oct. 2, 1978 and assigned to the same assignee as this application.

Still further this application relates to the application of Edward F. Scannell and Edward D. Orth, entitled Shielded Electrical Current Indicating Meter, Ser No. 948,197 filed Oct. 2, 1978 and assigned to the same assignee as this application.

BACKGROUND OF THE INVENTION

It is well known that electrical measuring instruments have very broad use in the electrical measuring art. Because of the large number of measurements which are made in regulating processes operated electrically there is need for large numbers of instruments. Because of the large number there is a premium on the smaller size instruments so that the instruments can be grouped to give readily available information to persons using the instruments.

Further, because of the very large number of such instruments which are used and the many purposes and applications in which they are employed, it is desirable that they be made at low cost and yet with high reliability and accuracy in performance.

This invention relates generally to the electrical instruments of the D'Arsonval type.

Instruments of the D'Arsonval type include a moving armature or coil assembly which is mounted for rotation through the field of a permanent magnet assembly. When the armature assembly is energized by means of a current flowing therethrough, the resulting magnetic fields interact to produce a torque which rotates the armature assembly relative to the permanent magnet assembly. An instrument pointer is generally connected to the movable armature assembly to yield a readout with respect to a faceplate or scale mounted behind the pointer as the torque is a function of the current magnitude.

One of the requirements for accuracy in instruments provided pursuant to the present invention is that they have a standard and reproducible reading from one instrument to another. In part this is dependent on having certain adjustments feasible in in the instrument and one such low-cost high-reliability and stable adjustment means is the subject of the present invention.

OBJECTS OF THE INVENTION

Accordingly, one object of the present invention is to provide a low cost highly reliable instrument having a low profile and having means incorporated within the instrument for making adjustments to the setting of the instrument.

Another object is to provide a simple means by which an instrument may be adjusted with reference to its setting.

A further object is to provide a mechanism which is simple to build and assemble and which makes possible the reliable setting of the values which are obtained from operation of an instrument.

Still another object of the invention is to provide a method of compensating for the settings of an instrument so that zero setting may be achieved with great precision and reliability at low cost.

Other objects and advantages of the present invention will be in part apparent and in part pointed out in the description which follows.

BRIEF SUMMARY OF THE INVENTION

An instrument is provided pursuant to the present invention which has indicating means which operate against the torsional force of the restoring element. The indicating means of the instrument is part of the instrument mechanism and the mechanism is mounted within an instrument casing. Means for adjusting the setting of the indicating means is provided and comprises essentially three elements. The first element is a rotatable element which is accessible at one end thereof from the exterior of the casing. The second element is an intermediate element which is actuated by movement of the internal end of the rotary element as the rotary motion is imparted to the external end thereof. The third element is a torsional adjusting element and this element is internal and mounted at one end thereof to the instrument mechanism. At the other end the torsion adjusting element is mechanically coupled with the intermediate element. Accordingly imparting of a rotary motion to the rotary element at an external surface of the instrument imparts a side to side lateral motion to the intermediate element and the side to side lateral motion of the intermediate element imparts a pivotal motion to the torsion adjusting element mounted to the instrument mechanism.

The adjustment is accomplished from either the sides of the casing of the instrument or from the rear of the casing, i.e., the side opposite the indicator or readout face of the instrument. The adjustments are initiated by rotation of a rotary element extending through the casing of the instrument at either the rear or the sides of the casing. In either case the rotary element has an interior portion which mates with an intermediate element capable of lateral or side to side motion within the casing.

BRIEF DESCRIPTION OF THE DRAWINGS

FIG. 5 is a top plan view of the internals of the instrument mechanism showing the relationship between an adjustment mechanism and the mechanism which is adjusted.

FIG. 6 is a sectional view taken along the line 6—6 of FIG. 5 and showing the means by which adjustment is achieved.

FIG. 7 is an illustration of a spring coil mechanism attached at each end of the spring coil to a tab which forms part of the structure of the instrument.

DESCRIPTION OF THE PREFERRED EMBODIMENT

Figure 1:
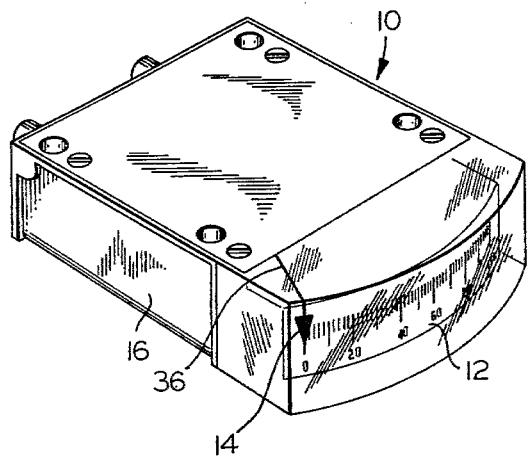
FIG. 1 is a perspective view of an instrument as provided pursuant to the present invention.

Referring first to FIG. 1, the instrument shown is one of a number of possible instruments which can be employed in accordance with the present invention. The particular instrument shown is an electrical measuring instrument having a front scale 12 a pointer 14 which shows the values indicated by the instrument on the scale and a generally rectangular housing 16 containing the sundry electrical elements and parts which make up the instrument. In the case of an electrical instrument the two electrical terminals 18 and 20 are the terminals to which wires carrying the current to be measured are connected.

Figure 2:
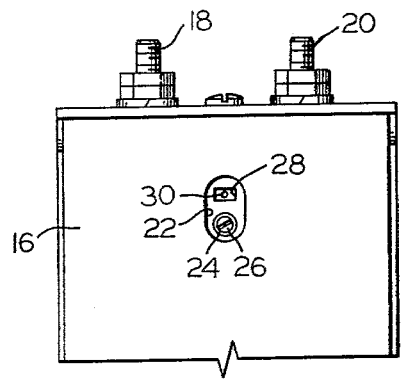
FIG. 2 is a partial bottom view of the instrument of FIG. 1.

In FIG. 2, an opening 22 in the bottom of casing 16 of instrument 10 makes visible a central hole 24 shown to include the screw member 26 and also to include the control window 28. Within the control window 28 there is illustrated one perforation 30 of a series of perforations in an annular leaf spring 32 only a portion of which is visible through the control window 28.

Figure 3:
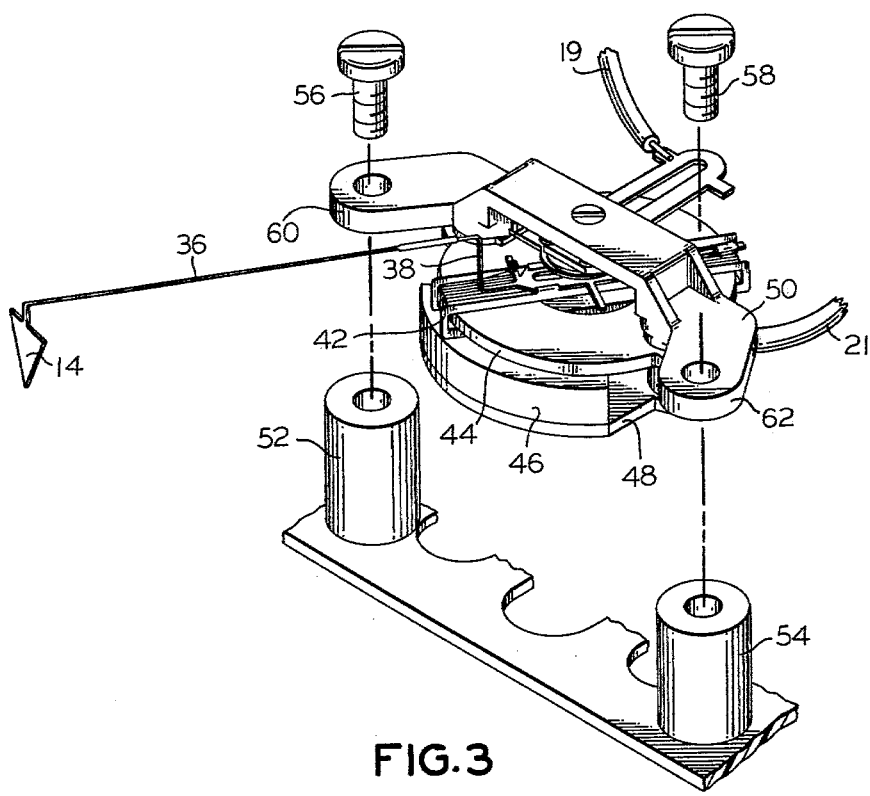
FIG. 3 is a partially exploded perspective view of the internal mechanism of the instrument of the present invention.

Referring next to FIG. 3, one form of mounting of portions of an electrical measuring instrument is shown in a partially exploded perspective view. The pointer 14 corresponds to the pointer 14 in FIG. 1. The pointer arm 36 extends back from the pointer 14 to the pointer arm support 38. This support 38 is formed integrally with a plate 40 and the plate is mounted on the bobbin 42. The bobbin pivots about an upper flux plate 44. A magnetic element 46 is disposed above lower flux plate 48. The assembly is supported by the yoke 50 and is assembled to the posts 52 and 54 in the housing element 16. The screw members 56 and 58 hold the arms 60 and 62 of the yoke 50 in the respective positions in the posts 52 and 54. Current is supplied to bobbin 42 through conductors 19 and 21 which are connected in turn to terminals 18 and 20.

Figure 4:
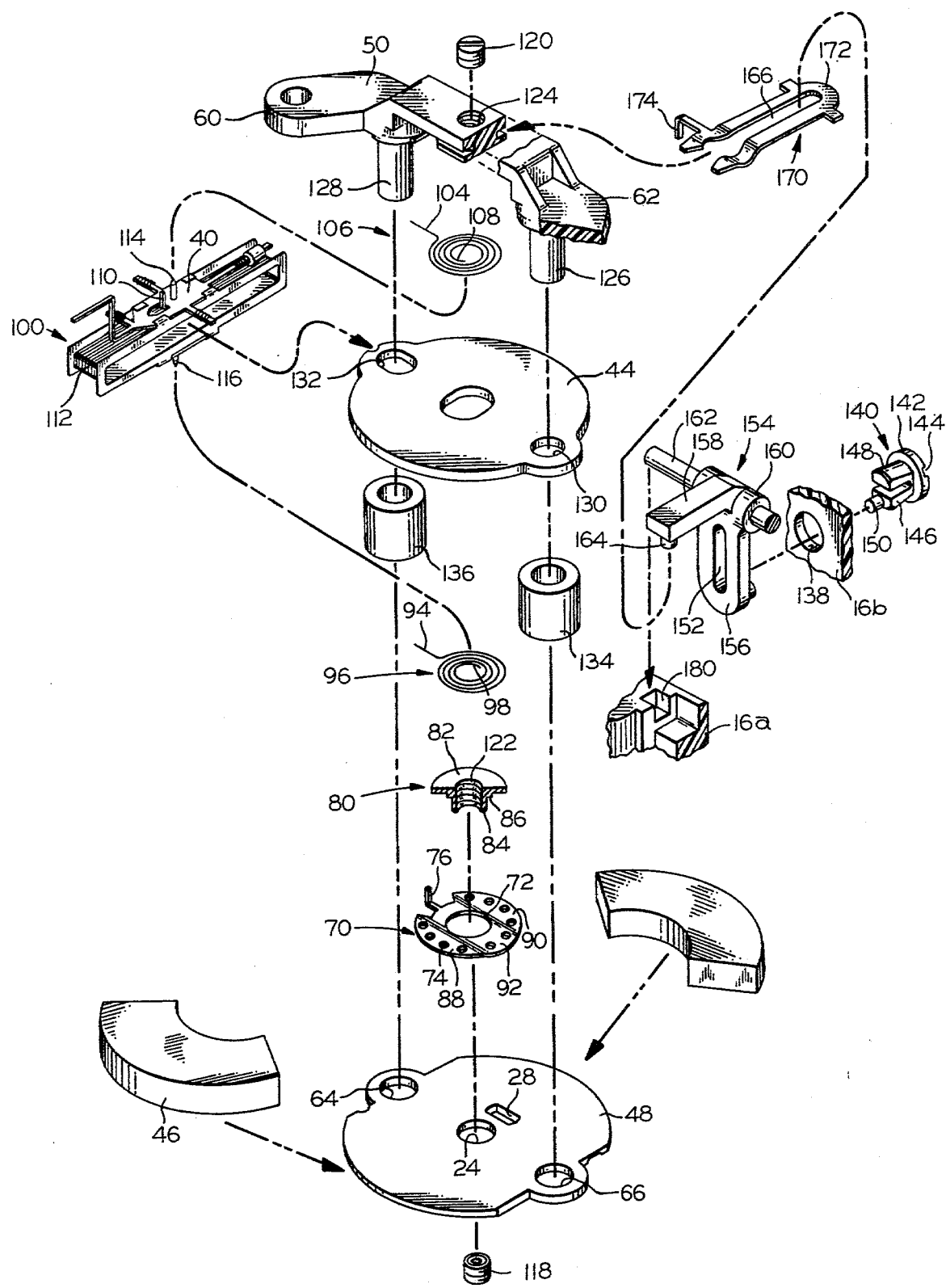
FIG. 4 is a more fully exploded view of the instrument mechanism of the present invention.

Turning next to FIG. 4, the mechanism illustrated in part in FIG. 3 is shown in more exploded view in FIG. 4. The portion of principal interest in relation to this invention is shown in the upper right portion of FIG. 4.

Starting at the bottom of FIG. 4 there is a flux plate 48 having a center opening 24 and two side openings 64 and 66. A control window 28 provides access from beneath plate 48 to a spring 70. The spring 70 is made up to include a center opening 72 as well as a number of peripheral openings 74. A side arm 76 for spring adjustment is formed integrally with the spring 70 and extends from one edge thereof to be attached as appropriate to a coil spring element 96 of the instrument or to an equivalent means.

A flanged assembly eyelet 80 is disposed above the spring 70 in the exploded view of the elements as illustrated in FIG. 4. The flanged assembly eyelet 80 includes the outwardly extending flange 82 and the downwardly extending collar 84. There is also a spacer shoulder 86 which is slightly smaller in diameter than the center opening 72 of the spring 70 and which is slightly less shallow than the full depth of the spring 70 with indentations made thereon. For example, in the spring regulator disc of FIG. 4 the two side portions 88 and 90 are raised relative to a central portion 92. Side arm 76 of spring 80 is attached to side arm 94 of a lower coil spring 96. Such attachment may be by brazing, soldering, welding or the like. Coil spring 96 is attached at its center arm 98 to the undercarriage of bobbin 100.

A coil 106 having an outer arm 104 and inner arm 108 is connected to the upper part of the bobbin 100 and to a pivot element 170 held in the yoke 50 to impart a certain torsional force on the bobbin 100 and on the pointer arm 36 extending from the bobbin. The attachment of the inner end 108 of coil 106 is to the upwardly extending contact arm 110 formed integrally with the plate 40. Pivoting of the bobbin under the influence of magnetic field generated by flow of current through the coil 112 of the bobbin is by means of the upper and lower pivot pins 114 and 116 mounted respectively above and below bobbin 100. The pivot pins turn within the jeweled recess in the upper and lower jeweled screw elements 118 and 120 respectively. These screw elements are mounted in receiving threaded openings 122 of collar 80 and 124 of yoke 50.

The yoke 50 has two depending legs 126 and 128 designed to be assembled through the openings 130 and 132 in upper flux plate 44 through the two bushings 134 and 136 and the two openings 64 and 66 of the lower flux plate 48 to complete the major assembly of the instrument mechanism. In this assembly the bobbin 100 and coil 112, which constitute the armature of the instrument, are positioned over the flux plate 44 and electrical connection to the winding 112 is accomplished through the respective torsion coil springs 96 and 106 respectively.

In accordance with the D'Arsonval operation of the instrument the flow of current through the coil 112 generates a force to cause the pivoting of the armature and the pointer 14 attached to the pointer arm 36. The deflection of the armature is resisted by the coil springs 96 and 106 so that when the current is no longer flowing in the coil 112 of the armature the armature and its indicating needle return to an at-rest position. It is principally in establishing a preferred at-rest position for the indicator that the subject matter of the subject invention plays a part. Actually what has been described to this point is the mechanism of the instrument with which the structure and combination of the present invention is employed rather than the subject matter of the specification and claims of this application.

Considering next the portions of the FIG. 4 shown in the upper right-hand section, there is illustrated the means by which adjustment of the pointer 14 or similar indicating means of the instrument operating according to the D'Arsonval principle is accomplished pursuant to this invention. This mechanism constitutes a torsion adjusting means for the indicating element of the electrical instrument described and shown in FIG. 4. The instrument as described and as assembled is actually contained within a casing, two portions of which 16a and 16b, are illustrated in the right-hand portion of FIG. 4. Casing portion 16b has an opening 138 which opening will admit a rotatable element 140. The rotatable element has the screw head 142 and it also has the screwdriver slot 144.

The inner portion of the rotatable element 140 is the two spring loaded legs 146 and 148. These legs may be forced together as the rotatable member is inserted through opening 138 but then they spring apart to hold the rotatable element 140 in place in opening 138 in the casing wall 16b. Accordingly when a tool is inserted in the slotted head 114 of the rotatable element and it is rotated, the rotational force applied to the head on the exterior of the casing will cause a corresponding rotation of the internal portion of the rotatable element 140. A boss 150 extends from one leg 146 of the two spring legs of rotatable element 140 and this boss will go through an eccentric circular rotation as the rotatable element itself is rotated. The head 142 and the legs 146 and 148 will all rotate as a unit and the boss 150 will take part in such rotation. However, the motion of boss 150 is essentially that of an element rotating about a center other than its own center and it will accordingly go through a generally circular motion eccentric to the center of rotatable element 140.

The boss 150 is engaged in a slot 152 of the intermediate element 154. Intermediate element 154 is generally of an inverted L-shape with the intersection of the two arms of the L forming a support sleeve 160 which rides on a guide rod 162 during its movement within the casing 16. In fact the downwardly extending arm 156 of intermediate element 154 is held in place by rod 162 so that it is activated and moved responsive to the movement of boss 150. Similarly the outwardly extending arm 158 of intermediate element 154 is moved laterally as the boss 150 goes through its circular path and operates on element 154 by the action of boss 150 in slot 152.

A boss 164 depends from the side arm 158 and this boss 164 operates in turn within the slot 166 of the pivot element 170. Accordingly if the boss 164 undergoes a lateral movement, due to and responsive to the rotary movement of boss 150, then the pivot element 170 will be pivoted at its outer end 172 as the element 170 pivots about a point which is located generally in the center of the yoke 50, and proximate the center of the screw element 120.

The pivot element 170 has a side contact arm 174 and this contact arm has attached to it the outer arm or outer end 104 of coil spring 106. Accordingly, as the outer end 172 of pivot element 170 undergoes side to side lateral movement under the urging of the boss 164, the side contact arm 174 undergoes a pivoting motion. As it pivots it carries the outer end 104 of coil spring 106 through an arc. Obviously the movement of the outer arm 104 of coil spring 106 through such arc has the effect of increasing or decreasing the torsion of the spring and accordingly the torsion which is exerted on the bobbin 100 inasmuch as the inner end 108 of the coil spring 106 is attached to the contact tab 110 of bobbin 100.

The rod 162 is nested within opening 180 formed integrally in the casing 16a of the instrument.

The relationship between the rod 162 and the intermediate element 154, on which rod the intermediate element goes through its lateral motion within the casing 16, is made clearer by reference to FIGS. 5 and 6. In FIG. 5 the rod 162 is seen to extend across the back of casing 16 proximate the rotary member 140. Intermediate member 154 is illustrated in FIG. 5 from the top so that the sleeve 160 and the outwardly extending arm 158 are viewed in this illustration. The boss 164 which depends from arm 158 is illustrated in phantom in place in the slot 166 of the pivot element 170.

As is also evident from the illustration in FIG. 5 the rod 162 is nested at each end in part of the casing 16 so that the sleeve 160 is free to move laterally back and forth by riding on the rod 162. When a tool blade is inserted in slot 144 of rotary element 140 and the element is turned the result is to impart a circular motion to the boss 150 on the inner end of the rotary element and this circular movement of the boss 150 generates a side to side lateral movement of the intermediate element 154. The lateral movement of intermediate element 154 in turn causes lateral movement of boss 164 and this lateral movement causes the pivot element 170 to pivot about the center where the jeweled screw element 120 is located. Side arm 174 of the pivot element 170 changes the torsional force applied by torsion spring 106 against the movement of arm 36 extending from the bobbin 100 to support an indicator at the end 14 of the arm.

Turning next to FIG. 6 this figure is a sectional view of the part of the instrument mechanism employable for adjustment as has just been described. FIG. 6 is a partial vertical section taken along the line 6—6 of FIG. 5 and illustrating particularly those elements of the structure which pertain to the adjustment feature of the present invention. The outer casing wall 16 has mounted therein rotary element 140. The rotary element includes the head 142 having slot 144 therein together with the spring legs 146 and 148. Leg 146 has boss 150 extending therefrom. Once the rotary element is inserted through the opening in wall 16 the outward spring action of the legs 146 and 148 keep it in place. The rotation of the element causes a circular movement of boss 150 and this boss 150 operates within the slot 152 of the intermediate element 154. Intermediate element 154 has downwardly extending arm 156 and an outwardly extending arm 158. The intermediate element itself is supported in sliding relation on the rod 162 by the sleeve 160 and the arm 158 in turn supports the downwardly extending boss 164. Boss 164 is engaged in slot 166 of the pivot element 172 so that as the intermediate element moves laterally back and forth on its support rod 162, it in turn generates a pivot motion on a part of the pivot element 166.

The effect of this pivotal motion on the torson exerted by spring 106 is illustrated in FIG. 7. As the downwardly extending contact arm 174 of pivot element 170 is moved through an arc as shown by the arrow above the spring 106 there is either an increased torsion or decreased torsion on coil spring 106. Where the pointer arm 36 extending from bobbin 100 is at the at-rest position, the result of the movement element 174 is to increase or decrease the torsion operating on contact element 110 of the bobbin 100 and to cause the bobbin and its pointer arm to be displaced either to the right or left of the at-rest position to a new at-rest or zero position. By adjusting the zero setting or at-rest position of the pointer arm the reading which is obtained through use of the instrument by passing a current through the winding 112 on bobbin 100 will result in an increased or decreased reading depending on the zero setting or at-rest setting of the indicator arm and also depending on the actual current flowing through the winding 112.

Figure 8:
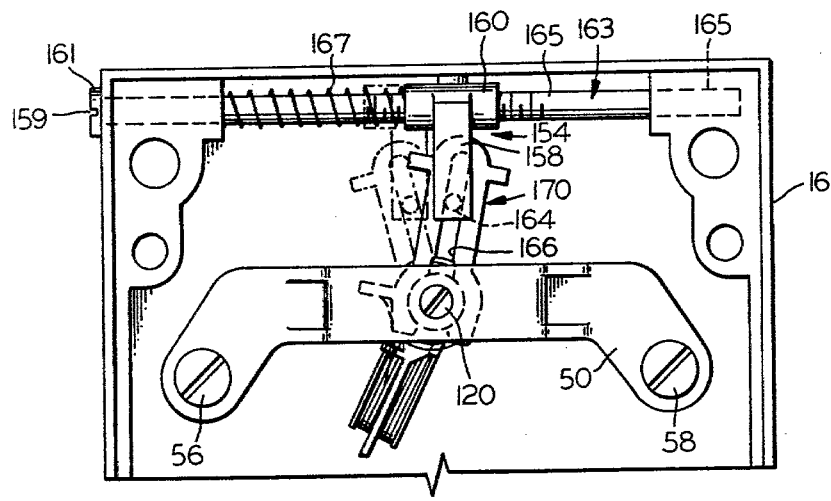
FIG. 8 is an illustration of an alternative mechanism for adjusting the zero point setting of an instrument.

Turning now to FIG. 8 an alternative form of the mechanism of the present invention is illustrated.

In the mechanism illustrated the rotary element is operated from a side of the housing of the instrument rather than from the back. The protruding end of the rotary element is illustrated at the left side of the housing 16 in FIG. 8 but as is readily evident the other end of the rotary element may extend through or be accessible from the right side of casing 16 or in fact may be accessible from both side surfaces of casing 16 through use of a double ended rotary instrument.

Considering the figure with greater particularity a rear portion of instrument casing 16 is illustrated and the instrument content is illustrated only to the degree needed to explain this alternative structure, the instrument having been more fully explained with reference to the other figures.

The yoke 50 is mounted in casing 16 by screws 56 and 58 as described above. Pivot element 170 is mechanically linked to intermediate element 154 at the arm 158 extending outward from support sleeve 160. The actual linkage is by means of boss 164 extending down from arm 154 into the slot 166 in pivot element 170. Accordingly lateral movement of intermediate element 154 causes a pivoting movement of element 170 about a center proximate jeweled screw 120.

Lateral movement of intermediate element 154 within casing 16 is caused by rotation of rotary element 163. The rotary element 163 is in the form of an elongated rod-like member having at least a middle portion 165 threaded. Sleeve 160 is internally threaded so that rotation of rod 163 causes lateral side to side movement of intermediate element 154.

Rod 163 is supported at its captive end 165 in the casing interior and it extends at its rotatable end through, or the end is accessible through, casing wall 16. In the form illustrated in FIG. 8 rod 163 is provided with a slotted head 161 having slot 159 adapted to receive a tool blade not shown. A helical spring 167 is mounted over rod 163 and bears against a flat surface of the case on one end and against sleeve 160 at the other end. The spring pressure serves to keep sleeve 160 at a well defined position over rod 163 and holds intermediate member 154 anywhere it is set by rotation of rod 163.

As is evident from the above, rod 163 is a rotary member which functions by rotation thereof to position intermediate member 154 in the same manner as the rotation of rotary element 140 of the previous figures.

What is claimed and sought to be protected by letters patent of the U.S. Patent and Trademark Office is the following:

1. Torsion adjusting means for the indicating element of an electrical instrument comprising:
    an instrument having an instrument casing and having an instrument mechanism within the casing, said instrument casing having a bobbin with an electrical conductor wound thereon and having torsion elements exerting a torsional force on the bobbin and an indicator extending from the bobbin;
    a rotatable element extending through the instrument casing with a portion thereof accessible from the casing exterior and an internal portion thereof disposed within the casing;
    said rotatable element being rotatable at an external portion thereof by imparting a rotary force to said external portion;
    the internal portion of said rotary element being adapted to impart lateral side to side movement within said casing as the external portion of said rotary element is rotated;
    an intermediate element within said housing mechanically coupled to the internal portion of said rotary element;
    said intermediate element being adapted to undergo a lateral movement responsive to force imparted by the internal portion of said rotary element;
    an internal elongated pivot element mounted at one end thereof to said instrument mechanism and being adapted to pivot relative to said mechanism to impart a pivot motion to a bobbin mounting means of said instrument and said internal elongated element being coupled at the extended end thereof into operative engagement with the intermediate element of said adjusting means.

2. The adjusting means of claim 1 in which the intermediate element is mounted in said casing to move laterally responsive to a threaded surface on the internal surface of the rotary element.

3. The adjusting means of claim 1 in which the external portion of the rotary element is at least on one side surface of said casing.

4. The adjusting means of claim 1 in which the external portion of the rotary element is at the back surface of said casing.

5. The adjusting means of claim 1 in which the rotary element extends through the two side surfaces of said casing.

6. The adjusting means of claim 4 in which the internal portion of the rotary element is a boss disposed eccentrically of said rotary element.

7. The adjusting means of claim 6 in which the intermediate element has a vertical slot opening and the boss of said rotary element is disposed in said slot in mechanical engagement therewith.

8. The adjusting means of claim 1 in which the pivot motion of said internal elongated element is transmitted to a coil spring to change the torsional force exerted by said spring on the bobbin.

* * * * *